(12) United States Patent
Singh

(10) Patent No.: US 8,766,229 B2
(45) Date of Patent: Jul. 1, 2014

(54) ELECTRONIC MEMORY DEVICE

(75) Inventor: Pawan Singh, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 14/003,309

(22) PCT Filed: Mar. 7, 2012

(86) PCT No.: PCT/EP2012/053931
§ 371 (c)(1),
(2), (4) Date: Oct. 10, 2013

(87) PCT Pub. No.: WO2012/136435
PCT Pub. Date: Oct. 11, 2012

(65) Prior Publication Data
US 2014/0034895 A1 Feb. 6, 2014

(30) Foreign Application Priority Data

Mar. 9, 2011 (FR) ...................................... 11 51913

(51) Int. Cl.
*H01L 21/00* (2006.01)
(52) U.S. Cl.
USPC .................................. 257/3; 257/2; 257/4
(58) Field of Classification Search
USPC ............................................................ 257/2–4
See application file for complete search history.

(56) References Cited

U.S. PATENT DOCUMENTS

| | | | |
|---|---|---|---|
| 7,067,348 B2 * | 6/2006 | Campbell et al. ............... | 438/95 |
| 7,071,021 B2 * | 7/2006 | Harshfield et al. ............. | 438/95 |
| 7,102,150 B2 * | 9/2006 | Harshfield et al. ............. | 257/2 |
| 7,235,419 B2 * | 6/2007 | Harshfield et al. ............. | 438/95 |
| 7,560,721 B1 | 7/2009 | Breitwisch et al. | |
| 7,977,722 B2 * | 7/2011 | Wang et al. ................... | 257/300 |
| 8,541,765 B2 * | 9/2013 | Marsh et al. ....................... | 257/4 |
| 2009/0289290 A1 * | 11/2009 | Huang et al. .................. | 257/300 |
| 2011/0267873 A1 * | 11/2011 | Huang et al. .................. | 365/153 |
| 2011/0291064 A1 * | 12/2011 | Marsh et al. ..................... | 257/4 |
| 2012/0280199 A1 * | 11/2012 | Takagi ............................ | 257/3 |
| 2013/0207068 A1 * | 8/2013 | Pellizzer ......................... | 257/5 |
| 2014/0021437 A1 * | 1/2014 | Marsh et al. ..................... | 257/4 |
| 2014/0034892 A1 * | 2/2014 | Erbetta et al. .................... | 257/2 |
| 2014/0034895 A1 * | 2/2014 | Singh .............................. | 257/3 |

FOREIGN PATENT DOCUMENTS

| | | | |
|---|---|---|---|
| FR | 2979739 A1 * | 3/2013 | |
| JP | 2010-153591 | 7/2010 | |
| WO | WO 2004/100217 | 11/2004 | |
| WO | WO 2012136435 A1 * | 10/2012 | |

OTHER PUBLICATIONS

International Search Report as issued for PCT/EP2012/053931.

* cited by examiner

*Primary Examiner* — Laura Menz
(74) *Attorney, Agent, or Firm* — Pillsbury Winthrop Shaw Pittman LLP

(57) ABSTRACT

An electronic device includes a first electrode, a second electrode, and a solid electrolyte made of an ion-conducting material, the first and second electrodes being configured to form a metal dendrite. The device further includes a third electrode, an interface layer contacting the third electrode and a third surface of the electrolyte, the interface layer being an ionic insulator and an electronic insulator. The third electrode and the dendrite are arranged such that the device has two resistive states.

13 Claims, 6 Drawing Sheets

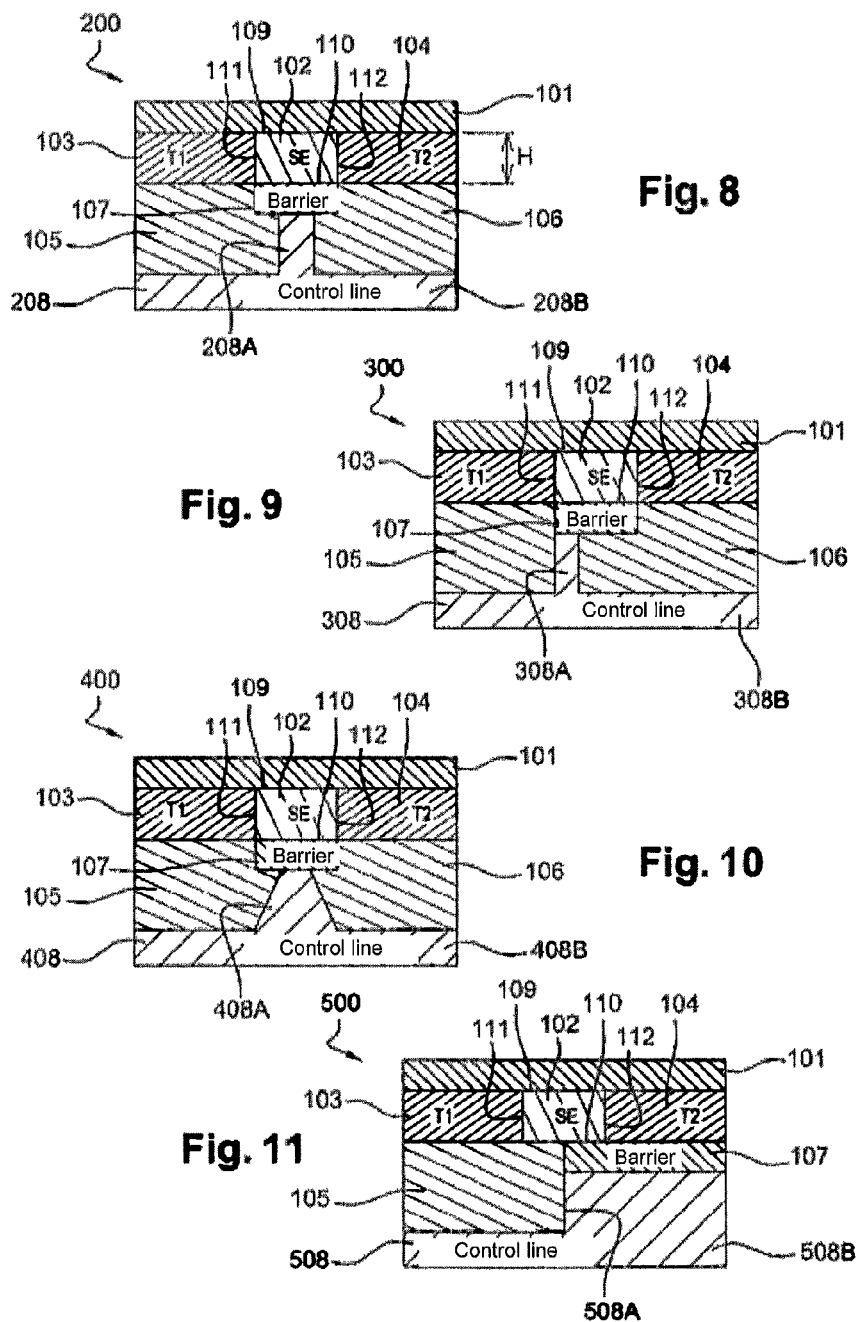

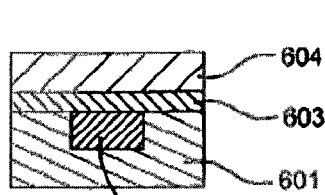 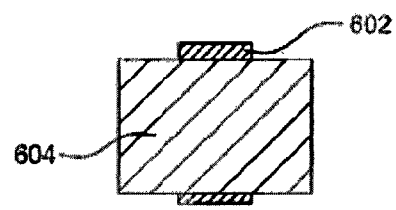
Fig. 12a  Fig. 12b
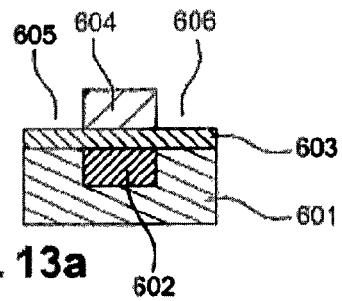 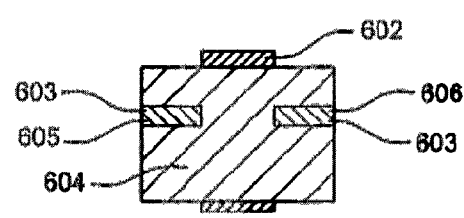
Fig. 13a  Fig. 13b
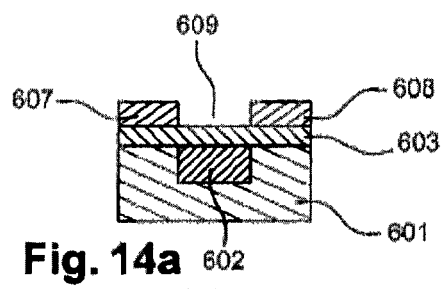 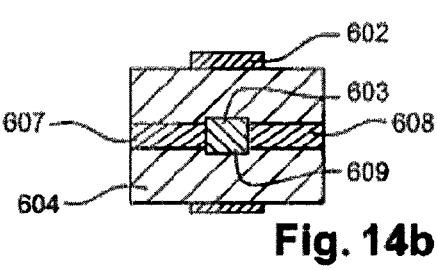
Fig. 14a  Fig. 14b
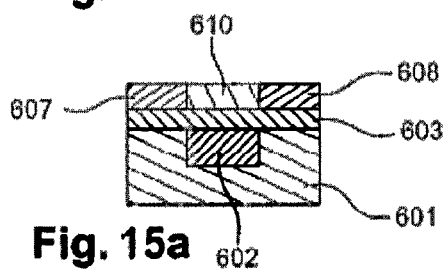 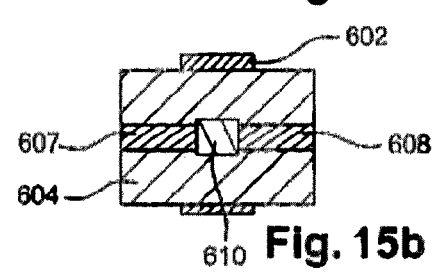
Fig. 15a  Fig. 15b
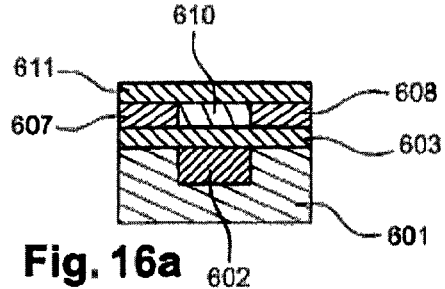 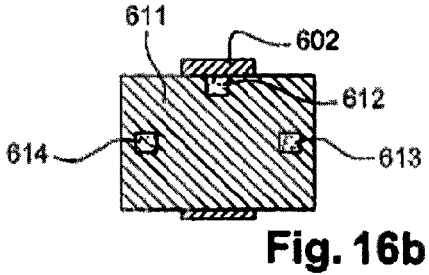
Fig. 16a  Fig. 16b

ELECTRONIC MEMORY DEVICE

CROSS-REFERENCE TO RELATED APPLICATIONS

This is the U.S. National Stage of PCT/EP2012/053931, filed Mar. 7, 2012, which in turn claims priority to French Patent Application No. 1151913, filed Mar. 9, 2011, the entire contents of all applications are incorporated herein by reference in their entireties.

The present invention relates to an electronic device; the invention relates more particularly to the field of rewritable memories, and more specifically to that of non-volatile ion conduction rewritable memories (CBRAM memories or Conductive Bridging RAM).

Depending on the targeted applications and performances, different types of memories are used.

Thus, SRAM type memories, or static random access memories, offer ultra-rapid writing times, required for example during calculations by a micro-processor. The major drawback of these memories is that they are volatile and that the size of the relatively large memory dot does not make it possible to obtain a large storage capacity in a reasonable volume.

DRAM type memories, or dynamic random access memories, realising storage of electrical charges in capacitances, offer a large storage capacity. These memories nevertheless have longer writing times (several tens of nanoseconds) than those of SRAM type memories and are themselves also volatile, the retention time of the information being of the order of several tens of milliseconds.

For applications that require storage of information even when the voltage is cut, non-volatile memories of EEPROM or FLASH type, which realise the storage of charges on the floating gates of field effect transistors, are used. These memories nevertheless have drawbacks:

- long writing times (several microseconds),
- limited density because the reduction in the size of the transistors leads to a reduction in the reading signal, in other words a lowering of the difference between the two states of the memory dot, and a reduction in the information retention time,
- limited number of writing cycles because the information retention decreases as writing cycles proceed due to the creation of defects in the gate oxide of the transistors, enabling electrons to escape from the floating gate.

More recently, other types of non-volatile rewritable memories have appeared, based on active materials such as ion conducting materials (CBRAM memories or Conductive Bridging RAM). These memories are resistive type memories (i.e. they can have at least two "off" or "on" states corresponding to the passage from a resistive state ("OFF" state) to a less resistive state ("ON" state)).

The operation of CBRAM type devices is based on the formation, within a solid electrolyte, of metal elements called "dendrites" between two electrodes, when said electrodes are taken to appropriate respective potentials. The formation of dendrites makes it possible to obtain a given electrical conduction between the two electrodes. By modifying the respective potentials applied to the electrodes, it is possible to modify the distribution and the number of dendrites, and thereby to modify the electrical conduction between the two electrodes. By reversing for example the potential between the electrodes, it is possible to make disappear or to reduce the dendrites, so as to eliminate or considerably reduce the electric conduction due to the presence of dendrites. CBRAM devices can also have an operation with two states: a state called "ON" and a state called "OFF" and play for example the role of memory cells.

FIG. 1 represents a basic diagram of an electronic device 10 of CBRAM type. Said device 10 comprises a solid electrolyte 14, for example based on doped chalcogenide such as GeSe, arranged between a lower nickel electrode 12, forming an inert cathode, and a portion of ionisable metal 16 based on silver, in other words a portion of metal that can easily form metal ions (here silver $Ag^+$ ions), and forming an anode. An upper electrode 18 is arranged on the portion of ionisable metal 16. These elements are electrically insulated by lateral dielectric portions based on $SiO_2$ or SiN, arranged around these elements. The device 10 represented in FIG. 1 typically forms a memory dot, in other words a unitary memory cell, of a memory comprising a multitude of these memory devices.

The memory state of a CBRAM memory device results from the difference in electrical resistivity between two states: ON and OFF. In the OFF state, the metal ions (here Ag+ ions) from the portion of ionisable metal 16 are dispersed throughout the solid electrolyte 14. Thus, no electrical contact is established between the anode and the cathode, in other words between the portion of ionisable metal 16 and the lower electrode 12. The solid electrolyte 14 forms an electrically insulating zone of high resistivity between the anode 16 and the cathode 12. A writing operation in the memory device 10 is carried out by applying a potential difference between the anode 16 and the cathode 12, for example in the form of a voltage ramp. The metal Ag+ ions initially dispersed in the solid electrolyte 14 then migrate towards the cathode 12 to form a metal deposit. This metal deposit takes the form of metal nanowires, called "dendrites", growing progressively within the electrolytic medium under the effect of the applied voltage and finishing by establishing electrical conducting bridges between the anode 16 and the cathode 12: this is the ON state. The solid electrolyte 14 then forms an electrically conducting zone thanks to the metal nanowires formed between the anode 16 and the cathode 12. An erasing operation is carried out by applying a potential difference of opposite sign, between the electrodes 12 and 18, the metal deposition (the nanowires) formed previously "dissolving" in ionic form in the solid electrolyte 14, enabling the memory device 10 to return to the OFF state. It will be noted that the first operation carried out on a CBRAM device consists in forming conductive dendrite(s) between the anode and the electrode, the passage from the ON state to the OFF state then taking place by reducing the length of the dendrite(s) without however dissolving the totality of the dendrites: this reduction in length suffices in fact to pass from a conducting state (i.e. the dendrite ensures the contact between the electrodes) to a non-conducting state (i.e. the dendrite is no longer long enough to ensure the conduction).

Such a CBRAM device nevertheless has certain drawbacks.

Thus, the formation of the conductive bridge (dendrite) takes place through an oxidation-reduction reaction with Ag+ ions which migrate from the anode to the cathode and electrons which go in the opposite direction. This reaction imposes creating a potential difference between the two electrodes and thus injecting a current that is going to pass through the electrolyte. FIG. 2 illustrates the evolution of the current passing through the electrolyte of a CBRAM device as a function of the voltage at the terminals of the electrodes. It should firstly be noted that the current of electrons (i.e. the electrochemical current) necessary for the oxidation-reduction reaction is largely a minority in the total current of electrons passing through the electrolyte, the majority of the current forming a parasite leakage current. In the present case, it will be noted that the intensity of the current passing through the electrolyte required to make the CBRAM device pass from an OFF state to an ON state is equal to around $10^{-3}$ A. Such a current corresponds to the potential difference required (i.e. here 0.2 V) to pass from a resistance $R_{OFF}$ of the order of $10^9$ Ohms to a resistance $R_{ON}$ of the order of $10^2$ Ohms. As illustrated in FIG. 3, the resistance $R_{ON}$ in the ON state is thus directly dependent on the intensity of the current passing through the electrolyte. Thus, as mentioned above, for a current of the order of $10^{-3}$ A, a resistance $R_{ON}$ of the order of $10^2$ Ohms is obtained; on the other hand, for a current of the order of $10^{-7}$ A, a resistance $R_{ON}$ of the order of $10^7$ Ohms is obtained: this then gives a ratio $R_{OFF}$ over $R_{ON}$ of the order of $10^2$ which can prove to be insufficient for certain applications. One is thus confronted with two constraints, the effects of which are opposed: on the one hand, it is necessary to obtain a sufficiently high ratio between the resistance $R_{OFF}$ and the resistance $R_{ON}$ and, on the other hand, it is necessary to limit the leakage current passing through the electrolyte and leading to high consumption of power and heating by Joule effect. In other words, reducing the leakage current leads to obtaining an insufficient $R_{OFF}/R_{ON}$ ratio and increasing the leakage current makes it possible to obtain a sufficient ratio but generates more important heating of the device.

Moreover, it will be noted that the intensity of the current necessary to make the device pass from the ON state to the OFF state is certainly less high than the intensity needed to pass from the OFF state to the ON state but also generates heating of the device.

In this context, the present invention aims to provide an electronic device of CBRAM ion conducting memory type making it possible to obtain a sufficiently high ratio between the resistance at the $R_{OFF}$ state and the resistance at the $R_{ON}$ state while limiting heating linked to the presence of a parasite leakage current.

To this end, the invention proposes an electronic device comprising:
  a first electrode;
  a second electrode;
  a solid electrolyte made of an ion-conducting material, said first and second electrodes being respectively in contact with one of the faces of said electrolyte on either side of said electrolyte, said first and second electrodes being configured to form a metal dendrite between said first electrode and said second electrode from metal ions circulating in said electrolyte when a potential difference is applied between said first and second electrodes;
said device being characterised in that it moreover comprises:
  a third electrode;
  an interface layer in contact with said third electrode and with a third face of said electrolyte different to the contact faces of said first and second electrodes, said interface layer being an ionic and electronic insulator, said interface layer being arranged between said third face and said third electrode so that it acts as electronic and ionic barrier between said electrolyte and said third electrode;
said third electrode and said dendrite being arranged so that said device has two resistive states:
  a first high resistive state when a first potential is applied to said third electrode so that a part of the ions forming said dendrite migrate under the effect of a first electric field generated by said first potential and leave said dendrite which no longer ensures the electrical contact between said first and said second electrode;
  a second low resistive state when a second potential different to said first potential is applied to said third electrode so that said part of the ions having left said dendrite migrate under the effect of a second electric field of opposite direction to said first electric field and generated by said second potential so as to reform said dendrite between said first electrode and said second electrode.

Dendrite is taken to mean at least one metal nanowire formed by the growth of metal ions within the electrolyte. The dendrite is created a first time over the whole length of the electrolyte (i.e. between the first electrode and the second electrode) for example by application of a potential difference between the first and the second electrode.

Thanks to the invention, a third electrode is added which is going to make it possible to play on the length of the dendrite initially formed by breaking the conductive bridge formed by the dendrite between the first and the second electrode to pass from the ON state to the OFF state (for example to write a "0" in the memory device) or by reforming said conductive bridge between the first and the second electrode to pass from the OFF state to the ON state (for example to write a "1" in the memory device. This third electrode thus serves typically to write/erase a binary information in the device represented by the resistive state of the device.

To do this, the third electrode of the device according to the invention is insulated from the electrolyte by an ionic and electronic barrier. By applying an ad hoc potential to the third electrode, an electric field is created within the electrolyte, the direction and the intensity of which are going to make it possible either to break the dendrite(s) present in the electrolyte by moving a part of the ions away from the dendrite or to reform the dendrite by making the ions return to form the conductive bridge. The third electrode being totally insulated ionically from the electrolyte, there is no risk that a part of the metal ions from the dendrite penetrates into the insulating barrier to come to deposit on the third electrode or that certain metal ions present in the electrolyte come from an oxidation-reduction reaction at the level of the third electrode. Moreover, the third electrode being totally insulated electronically from the electrolyte, it is possible to apply a high voltage to this electrode so as to obtain an electric field sufficient to obtain a high $R_{OFF}$ over $R_{ON}$ ratio with an extremely reduced or even zero leakage current passing through the electrolyte. As a consequence, losses by Joule effect are reduced. It will be noted that the phases of writing/erasing are carried out by means of the third electrode, the reading of the information linked to the resistive state being carried out with the aid of a current passing through the electrolyte by means of a potential difference between the first and second electrodes.

The device according to the invention may also have one or more of the characteristics below, considered individually or according to all technically possible combinations thereof:
  said at least one dendrite has at least one non uniform dimension along the electrolyte;
  said contact between said third electrode and said interface layer takes place uniquely on a part of the total length of the electrolyte so that the electric field generated by the application of a potential to said third electrode is concentrated at the level of said part of the total length of the electrolyte; total length of the electrolyte is taken to mean the length of the electrolyte measured between the first and the second electrode (i.e. along the dendrite);
  said contact between said third electrode and said interface layer takes place on a zone substantially in the middle of said electrolyte;

said contact between said third electrode and said interface layer takes place on a zone substantially arranged at one end of said electrolyte;

said contact between said third electrode and said interface layer takes place on a zone substantially arranged on one half of the length of said electrolyte;

said interface layer is made of a dielectric material such as SiN, SiC, AlN or SiCN;

said solid electrolyte is made of a chalcogenide material such as a selenide or a telluride, certain oxides such as $SiO_2$, $HfO_2$, $Ta_2O_5$, $TiO_2$, GdOx, CuOx, WOx, or sulphides such as $GeS_x$, $Cu_xS$ or AgS;

the device according to the invention comprises two electrically insulating zones able to insulate said third electrode respectively from said first and second electrode;

said at least one metal dendrite is located near to said interface layer;

the device according to the invention comprises a plurality of metal dendrites.

The subject matter of the present invention is also a memory cell comprising a device according to the invention characterised in that the two binary states of the memory are respectively represented by the high and low resistive state of the device.

The subject matter of the present invention is a module for interconnecting logic blocks belonging to a configurable logic circuit comprising at least one device according to the invention, said device connecting two zones of conducting segments.

Other characteristics and advantages of the invention will become clear from the description that is given hereafter, as an illustration and in no way limiting, with reference to the appended figures, among which:

FIG. 1 schematically represents an ion conducting device of CBRAM type according to the prior art;

FIG. 8 illustrates in a schematic manner a lateral sectional view of an electronic device according to a second embodiment of the invention;

FIG. 9 illustrates in a schematic manner a lateral sectional view of an electronic device according to a third embodiment of the invention;

FIG. 10 illustrates in a schematic manner a lateral sectional view of an electronic device according to a fourth embodiment of the invention;

FIG. 11 illustrates in a schematic manner a lateral sectional view of an electronic device according to a fifth embodiment of the invention;

FIGS. 12a and 12b to 16a and 16b illustrate the main steps of an example of method of manufacturing a device according to the invention;

In all the figures, common elements bear the same reference numbers.

Figure 1:
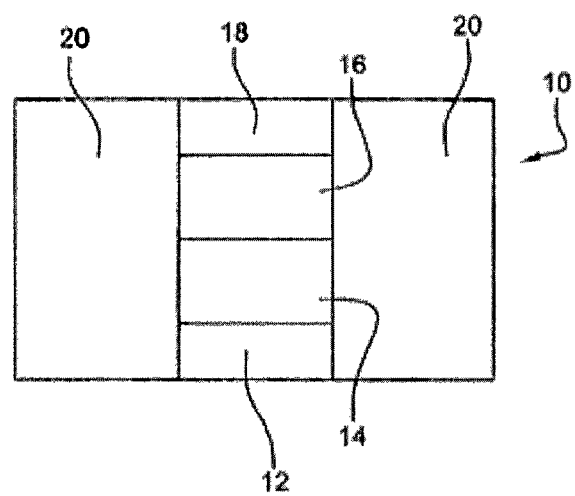
Figure 2:
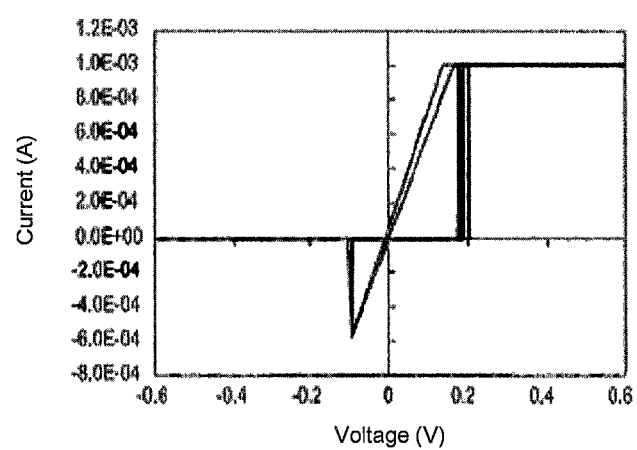
FIG. 2 illustrates the evolution of the voltage at the terminals of the electrodes of the device of FIG. 1 as a function of the current passing through the electrolyte.
Figure 3:
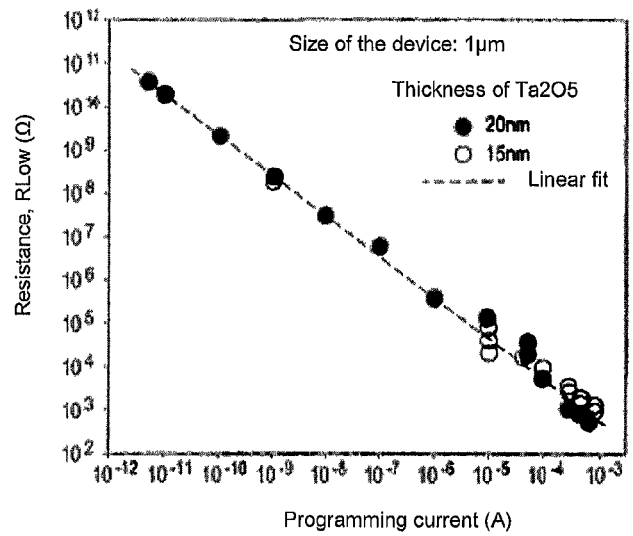
FIG. 3 represents the evolution of the $R_{ON}$ resistance in the ON state of the device of FIG. 1 as a function of the current passing through the electrolyte.

FIGS. 1 to 3 have already been described with reference to the prior art.

Figure 4:
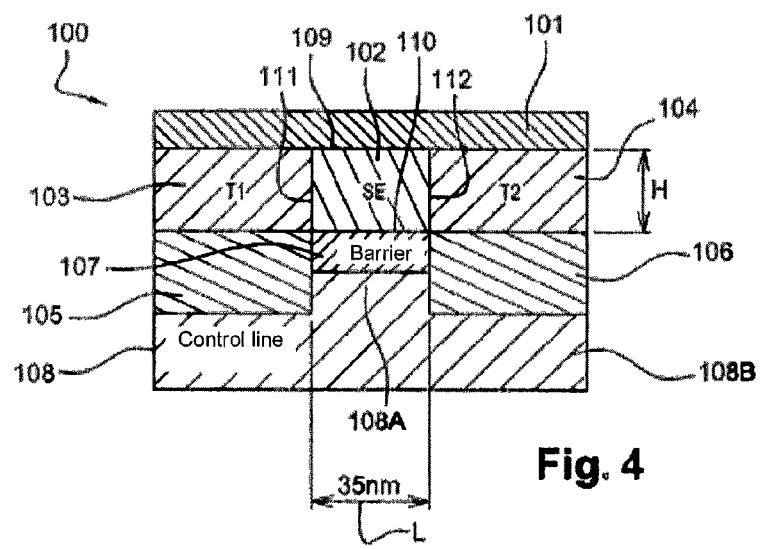
FIG. 4 illustrates in a schematic manner a lateral sectional view of an electronic device according to a first embodiment of the invention.

FIG. 4 schematically represents a lateral sectional view of an electronic device 100 of CBRAM (Conductive Bridging RAM) ion conducting memory type according to a first embodiment of the invention.

The electronic device 100 comprises:
a first electrically insulating zone 101;
a solid electrolyte 102;
a first electrode 103;
a second electrode 104;
a second and a third electrically insulating zone 105 and 106;
a fourth electrically insulating zone 107 called "diffusion barrier";
a third electrode 108.

The solid electrolyte 102 has at least three contact faces: here, the electrolyte 107 has the shape of a parallelepiped rectangle with four contact faces:
an upper face 109;
a lower face 110;
two lateral faces 111 and 112.

The solid electrolyte 102 may be formed from a chalcogenide material such as a selenide (GeSe) or a telluride, certain oxides such as $SiO_2$, $HfO_2$, $Ta_2O_5$, $TiO_2$, GdOx, CuOx, WOx, or sulphides such as $GeS_x$, $Cu_xS$ or AgS.

The first, second and third electrically insulating zones 101, 105 and 106 are for example made of dielectric material such as $SiO_2$.

The diffusion barrier 107 is for example made of a dielectric material such as SiN, SiC, AlN or SiCN.

The first and the second electrodes 103 and 104 are for example two metal electrodes made of Cu or Ag.

The third electrode 108 is for example made of a TiN material covering a zone of Cu.

The first lateral face 111 of the electrolyte 102 is in direct contact with the first electrode 103.

The second lateral face 112 of the electrolyte 102 is in direct contact with the second electrode 104.

In other words, the first and second electrodes 103 and 104 are each in contact with one of the faces of the electrolyte 102 on either side of the latter.

The first electrically insulating zone 101 covers the upper faces of the first electrode 103, the electrolyte 102 (upper face 109) and the second electrode arranged successively.

The lower face 110 of the electrolyte 102 is in contact with the diffusion barrier 107.

The diffusion barrier 107 acts as an interface arranged between the lower face 110 of the electrolyte 102 and the third electrode 108 so that it prevents the diffusion of $Cu^{2+}$ ions between the electrolyte 102 and the third electrode 108; the barrier 107 is also electrically insulating so that it prevents the conduction of electrons between the electrolyte 102 and the third electrode 108.

The third electrode 108 has an upper part 108A and a lower part 108B of length greater than the length of the upper part 108A. According to the embodiment described here, the length of the upper part 108A is substantially equal to the length L of the barrier 107 so that the upper zone 108A of the third electrode 108 is in contact with the barrier 107 over its whole length L; the length L is typically comprised between 10 and 50 nm. The height H of the electrolyte 102 is typically comprised between 10 and 100 nm.

The second and third electrically insulating zones 105 and 106 are located between the third electrode 108 and respectively the first and second electrodes 103 and 104 so as to electrically insulate the third electrode 108 from the first and second electrodes 103 and 104.

The operation of the device 100 will now be described with reference to FIGS. 5 to 7 which illustrate respectively the first operation carried out on the device 100, the passage from an ON state to an OFF state and the passage from an OFF state to an ON state.

Figure 5:
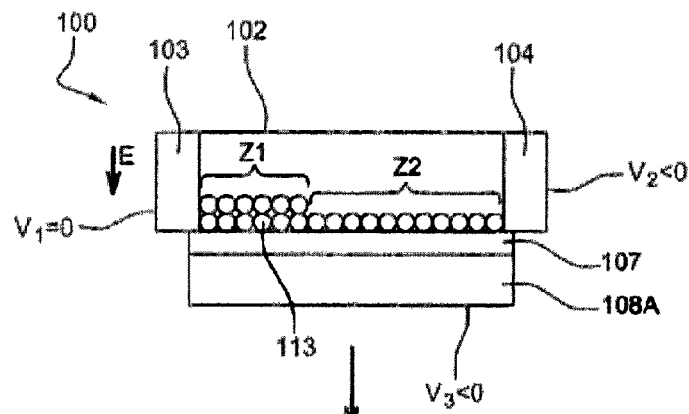
FIGS. 5 to 7 illustrate the operation of the device of FIG. 4.
Figure 6:
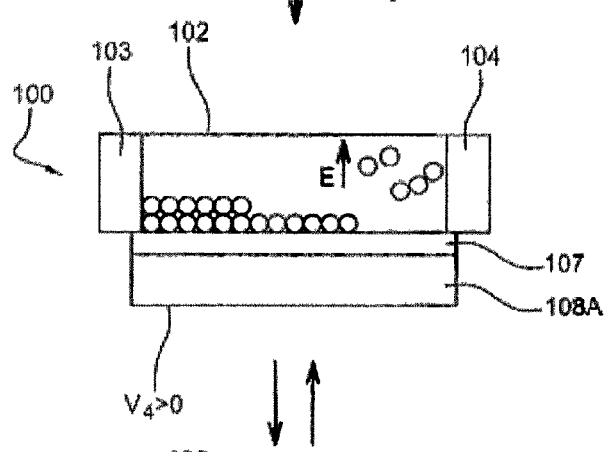
Figure 7:
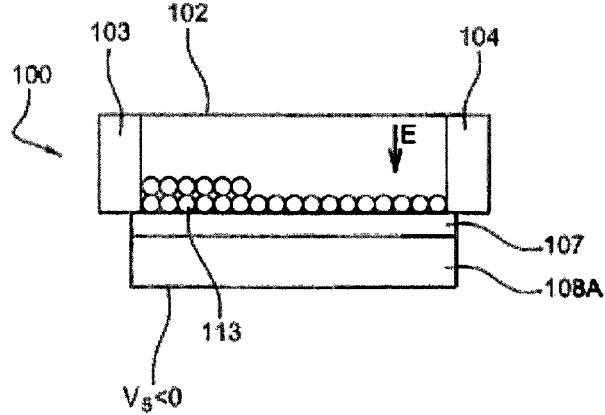

It will be noted that for the sake of simplicity, FIGS. 5 to 7 only represent a part of the device 100, the upper insulating zone 101 as well as lower zone 108B of the third electrode having been omitted.

According to a first configuration, not represented, metal ions (here $Cu^{2+}$ ions) either from one of the electrodes 103 or 104 or already present in the electrolyte 102 are initially dispersed throughout the solid electrolyte 102. Thus, no electrical contact is established between the first and second electrodes 103 and 104 forming the anode and the cathode of the electrolyte. The solid electrolyte 102 then forms an electrically insulating zone of high resistivity between the first and the second electrode 103 and 104. A first operation illustrated in FIG. 5, known as formation of dendrites in the device 100, is carried out by applying a potential difference between the first electrode 103 and the second electrode 104, for example in the form of a voltage ramp. The metal $Cu^{2+}$ ions initially dispersed in the solid electrolyte 14 then migrate to the second electrode 104 to form a metal deposit. This metal deposit takes the form of metal nanowires, called "dendrites", growing progressively within the electrolytic medium under the effect of the voltage applied and ending by establishing electrical conduction bridges between the first and the second electrode; a dendrite 113 is represented in FIG. 5. The solid electrolyte 104 then forms an electrically conducting zone thanks to the metal dendrite 113 formed between the first and the second electrode. It will be noted that the application of a negative voltage to the third electrode 108A moreover makes it possible to create the dendrite close to (and even in contact with) the diffusion barrier 107. The application of this voltage to the third electrode 108A is going in fact to generate an electric field E, the direction of which is going to tend to make the $Cu^{2+}$ ions migrate towards the barrier 107. It should also be noted that the dendrite 113 is not of uniform height over the whole length of the electrolyte 102: a first zone Z1 with a metal thickness greater than a second zone Z2 is thus observed. The configuration of the potentials applied to the three electrodes may thus be as follows: a zero potential V1 on the first electrode 103, a negative potential V2 on the second electrode 104 and a negative potential V3 on the third electrode 108A.

Once the dendrite 113 formed, the device 100 can pass from the ON mode (low resistance) to the OFF mode (resistance) (and conversely from the OFF mode to the ON mode) using uniquely the potential of the third electrode 108A.

As will be seen with reference to FIGS. 6 and 7, the third electrode 108A is thus going to make it possible to play on the length of the dendrite 113 initially formed by breaking the conductive bridge formed by the dendrite between the first and the second electrode 103 and 104 to pass from the QN state to the OFF state (for example to write a "0" in the device 100 operating as memory cellule) or by reforming said conductive bridge between the first and the second electrode 103 and 104 to pass from the OFF state to the ON state (for example to write a "1" in the device 100 operating as memory cell). This third electrode serves thus typically to write/erase a binary information in the device represented by the resistive state of the device. It will be noted that the phases of writing/ erasing are thus carried out by means of the third electrode 108A, the reading of the information linked to the resistive state being carried out with the aid of a current passing through the electrolyte with the aid of a potential difference between the first and second electrodes 103 and 104.

In FIG. 6, a positive potential V4 is applied to the third electrode, the potentials applied to the first and second electrodes 103 and 104 being zero or virtually zero. The presence of the potential V4>0 on the third electrode 108A is going to create an electric field E directed upwards which is going to tend to make a part of the $Cu^{2+}$ ions migrate upwards and thus break the conductive bridge formed by the dendrite 113 between the first and second electrodes 103 and 104. This phenomenon is here observed because the dendrite 113 as illustrated in FIG. 5 has a non-uniform dimension (i.e. a thickness) over the whole length of the electrolyte 102 so that the effect of the electric field E is not the same over the whole length of the dendrite 113; in other words, the dendrite is going to break preferentially at the level of the zone Z2 of less important thickness and be maintained as is in the zone Z1. The resistive state represented in FIG. 6 is thus a high resistance OFF state since the conductive bridge between the electrodes 103 and 104 is no longer assured.

Conversely, in FIG. 7, a positive potential V5 is applied to the third electrode, the potentials applied to the first and second electrodes 103 and 104 being zero or virtually zero. The presence of the potential V5>0 on the third electrode 108A is going to create an electric field E directed downwards which is going to tend to make a part of the $Cu^{2+}$ ions migrate downwards and thus reform the conductive bridge formed by the dendrite 113 between the first and second electrodes 103 and 104. The resistive state represented in FIG. 7 is thus a low resistance ON state since the conductive bridge between the electrodes 103 and 104 is once again assured.

Thanks to the device according to the invention, it is thus possible to pass from one resistive state to the other by applying an ad hoc potential to the third electrode 108A without making current flow in the electrolyte 102. The potential applied to the third electrode 108A may thus be sufficiently high to obtain the desired resistive state without having parasite leakage current passing through the electrolyte 102.

Obviously, in order that the device 100 according to the invention operates, it is important that the barrier 107 is non-conducting to ions and electrons so as to insulate the third electrode 108A from the electrolyte 102 and to avoid in particular that a conductive bridge can form between the electrolyte and the third electrode 108A. The height of the diffusion barrier 107 is of the order of ten or so nanometers, for example 20 nm.

The first step illustrated in FIG. 5 takes place during the first operation (formation of the conductive bridge); then, the destruction of the bridge or its reformation take place locally by means of the electric field generated by the potential applied to the third electrode 108A.

It will be noted that the destruction and the formation of the bridge are made possible in the case of the device 100 of FIGS. 4 to 7 by the non-uniformity of the dendrite 113 so that the effect of the electric field is not the same over the whole length of the dendrite.

According to a particularly advantageous second embodiment represented in FIG. 8, it is possible to have a device according to the invention also operating with a dendrite, the dimensions of which (and particularly its thickness) are uniform over the whole length of the electrolyte 102.

The device 200 of FIG. 8 is identical to the device 100 of FIGS. 4 to 7 (the common characteristics bearing the same references), the only difference consisting in using a third electrode 208 formed by a lower zone 208B and an upper zone 208, said upper zone 208A does not extend over the whole length of the electrolyte 102.

In the case in point, the upper zone 208A is here located substantially at the centre of the diffusion barrier 107 so that, when a potential is applied to the third electrode 208, the electric field generated by the application of a potential to the third electrode 208 is going to be concentrated in a zone located at the centre of the electrolyte. Thus, whatever the uniformity of the dendrite, the rupture of the latter is perfectly controlled because a localised field is applied which makes it possible to control the rupture zone of the conductive bridge (i.e. the dendrite) between the first and second electrodes 103 and 104. Such a configuration enables a better control (and a better repetition) of the operations (ON to OFF and OFF to ON) whatever the dimensions of the dendrite.

FIGS. 9 to 11 illustrate embodiments that constitute declinations of the embodiment described with reference to FIG. 8. In all cases, the contact between the third electrode and the diffusion barrier 107 takes place uniquely on a part of the total length of the electrolyte 102.

Concerning FIG. 9, the upper zone 308A of the third electrode 308 is located near to one of the ends of the barrier 107 (in the case in point the end close to the first electrode 103) so that, when a potential is applied to the third electrode 308, the electric field generated by the application of a potential to the third electrode 308 is going to be concentrated in a zone located at one end of the electrolyte.

Concerning FIG. 10, just as in FIG. 8, the upper zone 408A is here located substantially at the centre of the diffusion barrier 107 so that, when a potential is applied to the third electrode 408, the electric field generated by the application of a potential to the third electrode 408 is going to be concentrated in a zone located at the centre of the electrolyte. The upper zone 408A here has a trapezoidal shape which makes it possible to have a very precise and delimited localisation zone to apply the potential. The trapezoidal shape may also be replaced by a triangular shape.

Concerning FIG. 11, the upper zone 508A of the third electrode 508 is located substantially on one half of the barrier 107 (in the case in point, the half near to the second electrode 104) so that, when a potential is applied to the third electrode 308, the electric field generated by the application of a potential to the third electrode 308 is going to be concentrated in a zone located on this half of the electrolyte.

An example of embodiment illustrating the main steps of a method for manufacturing a device according to the invention will now be described with reference to FIGS. 12a and 12b to 16a and 16b.

The first step illustrated respectively in FIGS. 12a and 12b (respectively in side view and in top view) consists in forming the lower metal contact 601 corresponding to the third electrode of the device according to the invention; this step may be carried out by photolithoetching and metallisation of a dielectric oxide layer 602 (for example made of $SiO_2$) so as to obtain a line of metal that will form the third electrode. A step of planarization of the surface of the line of metal 601, for example CMP (Chemical Mechanical Polishing) may then be carried out.

Then successively is carried out the deposition of a diffusion barrier dielectric layer 603 (for example made of SiN, SiC, AlN or SiCN) impermeable to ions and to electrons then an insulating dielectric layer 604 (for example made of $SiO_2$).

With reference to FIGS. 13a and 13b (respectively in side view and in top view), one or more steps of photolithoetching through the insulating dielectric layer 604 are then carried out so as to obtain two openings 605 and 606. The shape of the openings 605 and 606 corresponds to the respective shape of the first and second electrodes of the device according to the invention.

With reference to FIGS. 14a and 14b (respectively in side view and in top view), a step of deposition of metal such as Cu is carried out to obtain the first and second electrodes 607 and 608 of the device according to the invention within the two openings 605 and 606 illustrated previously. The metal deposition may be carried out by a technique of PVD type (Physical Vapour Deposition), for example by cathodic sputtering. A step of planarization of the surface of the metal electrodes, for example by CMP (Chemical Mechanical Polishing) may then be carried out. A zone of the insulating dielectric layer 604 situated between the two electrodes is removed by etching so as to form an opening 609, the shape of which corresponds to the shape of the electrolyte of the device according to the invention.

With reference to FIGS. 15a and 15b (respectively in side view and in top view), the deposition is carried out of the solid electrolyte 610 within the opening 609, from a chalcogenide material such as a selenide or a telluride, certain oxides such as $SiO_2$, $HfO_2$, $Ta_2O_5$, $TiO_2$, GdOx, CuOx, WOx, or sulphides such as $GeS_x$, $Cu_xS$ or AgS. Different deposition techniques may be used to carry out this deposition, for example growths of CVD (Chemical Vapour Deposition) or ALD (Atomic Layer Deposition) type.

A step of planarization of the surface formed by the two electrodes 607 and 608 and the solid electrolyte 610, for example by CMP (Chemical Mechanical Polishing) may then be carried out.

With reference to FIGS. 16a and 16b (respectively in side view and in top view), the deposition is then carried out of an upper insulating dielectric layer (for example made of $SiO_2$) 611 which covers the first and second electrodes 607 and 608 as well as the solid electrolyte 610. Access contacts 612, 613 and 614 may moreover be obtained by the formation of metal vias for respective access to the third electrode 602, to the second electrode 608 and to the first electrode 607.

The device according to the invention finds a particularly interesting application in the field of FPGA (Field-Programmable Gate Arrays) and more precisely by using the device in a switch block of such a FPGA.

FPGA circuits are constituted of an array of CLB (Configurable Logic Blocks) surrounded by configurable input output blocks. The CLB are connected by a programmable interconnection network in the form of an interconnection array such as the array 700 illustrated in FIG. 17. The role of an interconnection array is to connect the CLB together. The array 700 is composed of vertical conducting segments $701i$ (here 4 vertical segments $701_1$ to $701_4$, i varying from 1 to 4) and horizontal conducting segments $702i$ (here 4 horizontal segments $702_1$ to $702_4$, i varying from 1 to 4).

Each intersection point of a horizontal segment and a vertical segment located on the diagonal of the array 700 is an interconnection module $703i$ (here 4 interconnection modules $703_1$ to $703_4$, i varying from 1 to 4).

Figure 17:
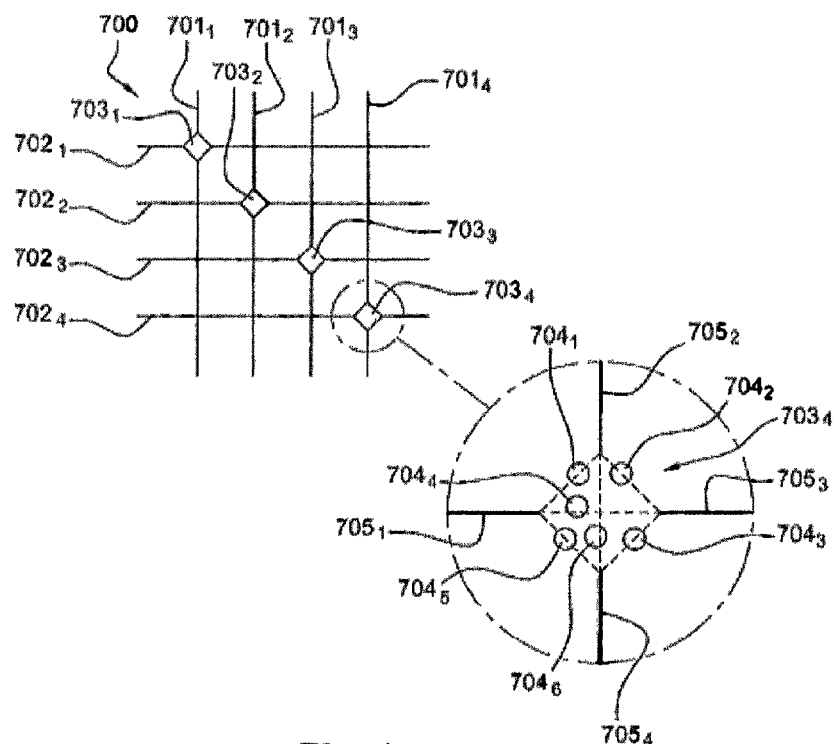
FIG. 17 represents an interconnection array of an FPGA type circuit using a device according to the invention.

As an illustration, an enlargement of the interconnection module $703_4$ is also represented in FIG. 17, the other interconnection modules $703_1$ to $703_3$ being identical.

According to the invention, this interconnection module $703_4$ comprises six devices $704_i$ according to the invention ($704_1$ to $704_6$). Each device $704_i$ is for example identical to the device 100 represented in FIG. 1.

Four zones of segments $705_1$ to $705_4$ join each other at the level of the module $703_4$. The operating principle of the module $703_4$ is that each of four zones of segments $705_1$ to $705_4$ may be connected to any of the three zones of remaining segments via one of the six devices according to the invention $704_1$ to $704_6$ acting as a voltage controlled switch.

Most of the interconnection modules of the logic blocks of large modern FPGA comprise devices of SRAM (Static RAM), EEPROM or anti-fuse type for the formation of switches. Anti-fuse technology is a less expensive technology than SRAM and EEPROM technologies, it makes it possible to attain higher speeds and takes up less space on the circuit. On the other hand, it can only be programmed a single time. EEPROM technology requires additional masking steps during its manufacture compared to the manufacture of SRAM and anti-fuse technologies. SRAM technology has the lowest performances and requires a very considerable surface of silicon, its main advantage residing in its large number of writing cycles (versus anti-fuse and EEPROM technologies) and in the fact that it enables a rapid reconfiguration within the circuit itself (unlike anti-fuse technology).

The device according to the invention makes it possible to combine all of the performances of the aforementioned technologies: speed performances similar to that of anti-fuse technologies, a capacity to absorb a large number of writing cycles, a low surface used and a low number of manufacturing steps.

Obviously, the device and the method according to the invention are not limited to the embodiments that have been described by way of indication and in no way limiting with reference to FIGS. 1 to 17.

Thus, even though the invention has been described in an illustrative manner by means of one dendrite, it is understood that the device according to the invention may comprise a plurality of dendrites distributed within the electrolyte. Its low power consumption moreover enables a rapid reconfiguration within the circuit itself.

Moreover, the metal ions present in the electrolyte may be obtained either via the metal of one of the first or second electrodes of soluble metal (Ag or Cu) which dissolves in the electrolyte (dissolution either spontaneous or stimulated) but it is also possible to obtain an electrolyte comprising metal ions obtained by co-sputtering of the material of the solid electrolyte and a metal soluble in the material of the solid electrolyte so as to obtain an electrolyte integrating metal ions.

Finally, even though the invention has been described in the case of two electrodes (the first and the second electrodes) made of a soluble metal (Ag or Cu for example), it is also possible to implement the invention with a single electrode made of soluble metal, the other being made of insoluble metal (for example made of TiN) or even with two electrodes made of insoluble metal in the case of an electrolyte obtained by co-sputtering.

The invention claimed is:

1. Electronic device comprising:
a first electrode;
a second electrode;
a solid electrolyte made of an ion-conducting material, said first and second electrodes being respectively in contact with one of the faces of said electrolyte on either side of said electrolyte, said first and second electrodes being configured to form a metal dendrite between said first electrode and said second electrode from metal ions circulating in said electrolyte when a potential difference is applied between said first and second electrodes;
a third electrode;
an interface layer in contact with said third electrode and with a third face of said electrolyte different from the contact faces of said first and second electrodes, said interface layer being an ionic and electronic insulator, said interface layer being arranged between said third face and said third electrode so that said interface layer acts as electronic and ionic barrier between said electrolyte and said third electrode;
said third electrode and said dendrite being arranged so that said device has two resistive states:
a first high resistive state when a first potential is applied to said third electrode so that part of the ions forming said dendrite migrate under the effect of a first electric field generated by said first potential and leave said dendrite which no longer ensures the electrical contact between said first and said second electrode;
a second low resistive state when a second potential different from said first potential is applied to said third electrode so that said part of the ions having left said dendrite migrate under the effect of a second electric field of direction opposite to said first electric field and generated by said second potential so as to reform said dendrite between said first electrode and said second electrode,
wherein said contact between said third electrode and said interface layer takes place uniquely on a part of a total length of the electrolyte so that the electric field generated by the application of a potential to said third electrode is concentrated at the level of said part of the total length of the electrolyte.

2. The device according to claim 1, wherein said dendrite has at least one non-uniform dimension along the electrolyte.

3. The device according to claim 1, wherein said contact between said third electrode and said interface layer takes place on a zone substantially in the middle of said electrolyte.

4. The device according to claim 1, wherein said contact between said third electrode and said interface layer takes place on a zone substantially arranged at one end of said electrolyte.

5. The device according to claim 1, wherein said contact between said third electrode and said interface layer takes place on a zone substantially arranged on one half of the length of said electrolyte.

6. The device according to claim 1, wherein said interface layer is made of a dielectric material including SiN, SiC, AlN or SiCN.

7. The device according to claim 1, wherein said solid electrolyte is made of a chalcogenide material, an oxide, or a sulphide.

8. The device according to claim 1, comprising two electrically insulating zones able to insulate said third electrode respectively from said first and second electrode.

9. The device according to claim 1, wherein said metal dendrite is located near to said interface layer.

10. The device according to claim 1, comprising a plurality of metal dendrites.

11. Memory cell comprising a device according to claim 1, wherein the two binary states of the memory are respectively represented by the high and low resistive state of the device.

12. Interconnection module of logic blocks belonging to a configurable logic circuit comprising at least one device according to claim 1, said device connecting two zones of conducting segments.

13. The device according to claim 7, wherein said chalcogenide material is a selenide or a telluride, said oxide is $SiO_2$, $HfO_2$, $Ta_2O_5$, $TiO_2$, GdOx, CuOx, or WOx, and said sulphide is $GeS_x$, $Cu_xS$ or AgS.

* * * * *